US011183430B2

(12) United States Patent
Cheng et al.

(10) Patent No.: US 11,183,430 B2
(45) Date of Patent: Nov. 23, 2021

(54) SELF-LIMITING LINERS FOR INCREASING CONTACT TRENCH VOLUME IN N-TYPE AND P-TYPE TRANSISTORS

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/564,666

(22) Filed: Sep. 9, 2019

(65) Prior Publication Data
US 2019/0393103 A1 Dec. 26, 2019

Related U.S. Application Data

(62) Division of application No. 16/002,559, filed on Jun. 7, 2018, now Pat. No. 10,665,511.

(51) Int. Cl.
*H01L 21/8238* (2006.01)
*H01L 21/02* (2006.01)
*H01L 29/417* (2006.01)

(52) U.S. Cl.
CPC ............ *H01L 21/823814* (2013.01); *H01L 21/02381* (2013.01); *H01L 21/02532* (2013.01);
(Continued)

(58) Field of Classification Search
CPC ....... H01L 21/823814; H01L 29/41791; H01L 29/66795; H01L 21/823821; H01L 27/0924; H01L 21/02532; H01L 21/02381
See application file for complete search history.

(56) References Cited

U.S. PATENT DOCUMENTS 7,598,145 B2 10/2009 Damlencourt et al.
7,692,213 B2 4/2010 Teo et al.
(Continued)

OTHER PUBLICATIONS

Cheng et al., "Self-Limiting Liners for Increasing Contact Trench vol. In N-Type and P-Type Transistors," U.S. Appl. No. 16/002,559, filed Jun. 7, 2018.
(Continued)

*Primary Examiner* — Nelson Garces
(74) *Attorney, Agent, or Firm* — Cantor Colburn LLP; Randall Bluestone

(57) ABSTRACT

Embodiments of the invention include semiconductor devices having a first n-type S/D region, a second n-type S/D region, and a first layer of protective material over the second n-type S/D region, wherein the first layer of protective material includes a first type of material and a second type of material. A second layer of protective material is formed over the first layer of protective material, wherein the second layer of protective material includes an oxide of the second type of material. The devices further include a first p-type S/D region, a second p-type S/D region, and the second layer of protective material over the second p-type S/D region, wherein the second p-type S/D region second layer of protective material includes the first type of material and the second type of material, and wherein the second layer of protective material includes the oxide of the second type of material.

7 Claims, 10 Drawing Sheets

(52) U.S. Cl.
CPC ............... *H01L 21/02603* (2013.01); *H01L 21/823828* (2013.01); *H01L 21/823864* (2013.01); *H01L 29/41791* (2013.01)

(56) References Cited

U.S. PATENT DOCUMENTS

| | | | |
|---|---|---|---|
| 7,851,790 B2 | 12/2010 | Rachmady et al. | |
| 8,211,761 B2 | 7/2012 | Tan et al. | |
| 9,171,715 B2 | 10/2015 | Matero | |
| 9,330,899 B2 | 5/2016 | Jung et al. | |
| 9,859,387 B2 | 1/2018 | Kim et al. | |
| 2008/0083955 A1* | 4/2008 | Kanarsky | H01L 29/7845 257/382 |
| 2011/0147811 A1* | 6/2011 | Kavalieros | H01L 29/66795 257/288 |
| 2013/0241004 A1* | 9/2013 | Yin | H01L 29/4966 257/392 |
| 2014/0170839 A1* | 6/2014 | Brunco | H01L 29/66795 438/479 |
| 2017/0229460 A1* | 8/2017 | Czornomaz | H01L 27/0922 |
| 2018/0090494 A1* | 3/2018 | Chao | H01L 27/0924 |
| 2019/0319098 A1* | 10/2019 | Tai | H01L 29/165 |

OTHER PUBLICATIONS

Chui et al., "Source/Drain Germanium Condensation for p. Channel Strained Ultra-Thin Body Transistors," IEEE International Electron Devices Meeting, IEDM, 2005, pp. 493-496.
List of IBM Patents or Patent Applications Treated as Related; Date Filed: Sep. 9, 2019, 2 pages.
Niu et al., "Interface Preservation During Ge-Rich Source/Drain Contact Formation," 27th Annual Semi Advanced Semiconductor Manufacturing Conference (ASMC), 2016, pp. 320-323.
Wang et al., "Desorption kinetics of GeO from GeO2/Ge structure," Journal of Applied Physics, vol. 108, No. 5, 2010, 054104, 8 pages.

* cited by examiner

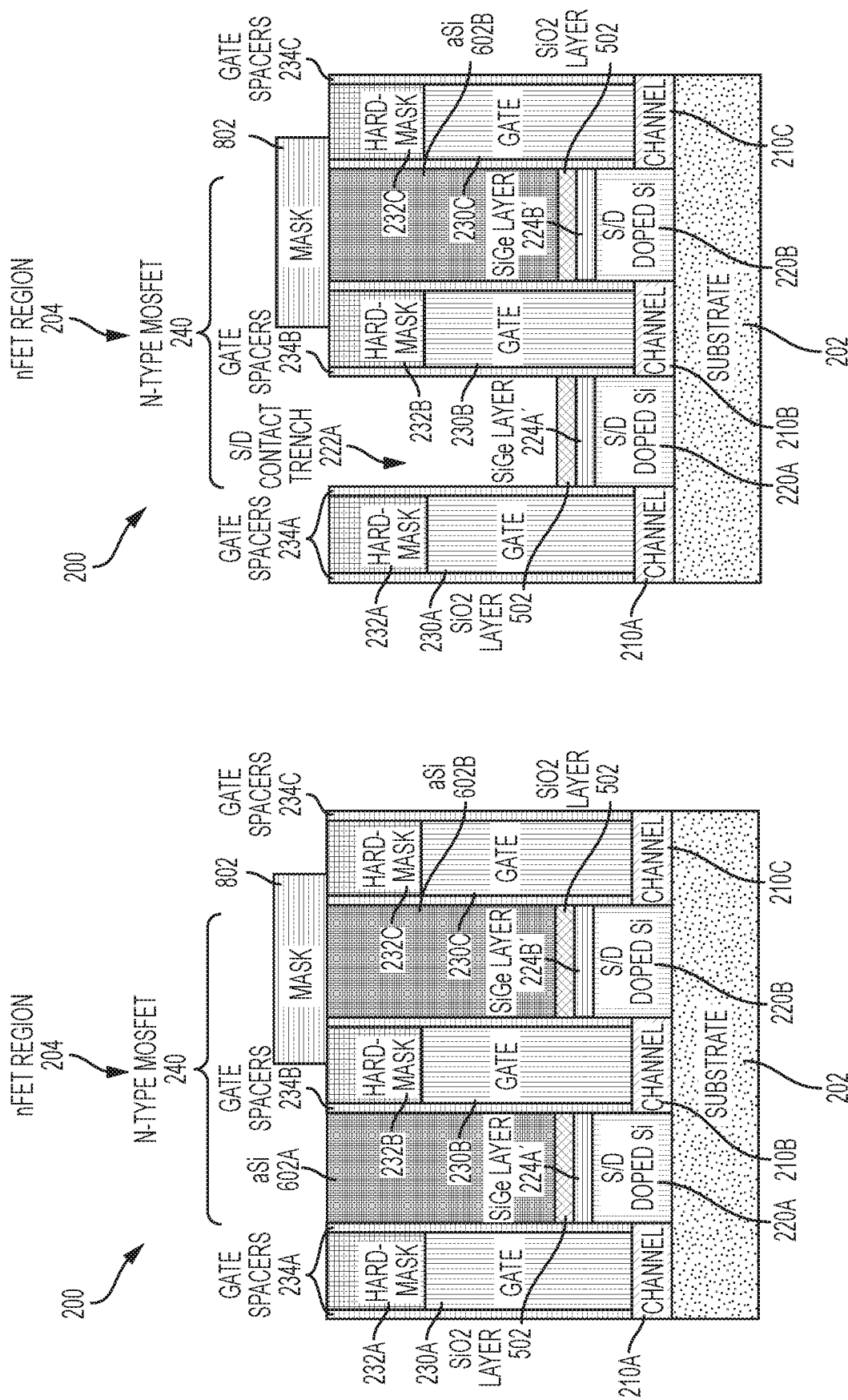

SELF-LIMITING LINERS FOR INCREASING CONTACT TRENCH VOLUME IN N-TYPE AND P-TYPE TRANSISTORS

DOMESTIC PRIORITY

This application is a divisional of U.S. application Ser. No. 16/002,559, filed Jun. 7, 2018, the contents of which are incorporated by reference herein in its entirety.

BACKGROUND

The present invention relates in general to fabrication methods and resulting structures for semiconductor devices. More specifically, the present invention relates to fabrication methods and resulting structures for self-limiting liners configured and arranged to increase the contact trench volume in n-type and p-type transistors.

Some non-planar metal oxide semiconductor field effect transistors (MOSFETs), such as fin-type field effect transistors (FinFETs), employ semiconductor fins and a gate structure wrapped over the sidewalls and top of a central portion of the fin. The central portion of the fin functions as the channel, and the portions of the fin that are not under the gate function as the source and the drain. Raised source/drain (S/D) regions can be epitaxially grown over the S/D portions of the fin to increase the S/D volume and provide a larger surface for interfacing with S/D conductive contacts.

SUMMARY

Embodiments of the invention are directed to a method of forming a protective liner of a semiconductor device. A non-limiting example of the method includes forming a source or a drain (S/D) region, forming a first layer of protective material over a top surface of the S/D region, and forming a second layer of protective material over the first layer of protective material, wherein the second layer of protective material includes an oxide of a first type of material. An anneal is applied to the first layer and the second layer to drive the first type of material into the first layer, drive a second type of material from the first layer into the second layer, and convert at least a portion of the second layer of protective material to an oxide of the second type of material, wherein the oxide of the second type of material is the protective liner.

Embodiments of the invention are directed to a method of forming protective liners of semiconductor devices formed on a substrate. A non-limiting example of the method includes, in an n-type region of the substrate, performing fabrication operations that include forming an n-type source or a drain (S/D) region, forming a first layer of protective material over a top surface of the n-type S/D region, and forming a second layer of protective material over the first layer of protective material, wherein the second layer of protective material includes an oxide of a first type of material. An anneal is applied to the first layer and the second layer to drive the first type of material into the first layer, drive a second type of material from the first layer into the second layer, and convert at least a first portion of the second layer of protective material to a first oxide of the second type of material, wherein the first oxide of the second type of material includes a protective liner of the n-type S/D region. The method further includes, in a p-type region of the substrate, performing fabrication operations that include forming a p-type S/D region and forming the second layer of protective material over a top surface of the p-type S/D region, wherein the second layer of protective material includes the oxide of the first type of material. An anneal is applied to the first layer and the p-type S/D region to drive the first type of material into the p-type S/D region, drive the second type of material from the p-type S/D region into the second layer, and convert at least a second portion of the second layer of protective material to a second oxide of the second type of material, wherein the second oxide of the second type of material is a protective liner of the p-type S/D region.

Embodiments of the invention are directed to a set of semiconductor devices formed on a substrate. A non-limiting example of the devices includes an n-type region having a first n-type S/D region, a second n-type S/D region, and a first layer of protective material over a top surface of the second n-type S/D region, wherein the first layer of protective material includes a first type of material and a second type of material. A second layer of protective material is formed over the first layer of protective material, wherein the second layer of protective material includes an oxide of the second type of material. The non-limiting example of the devices includes a p-type region having a first p-type S/D region, a second p-type S/D region, and the second layer of protective material over a top surface of the second p-type S/D region, wherein the second p-type S/D region second layer of protective material includes the first type of material and the second type of material, and wherein the second layer of protective material includes the oxide of the second type of material.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2A-13 depict cross-sectional views of a section of a substrate/wafer after various fabrication operations to form n-type MOSFETs and p-type MOSFETs thereon according to embodiments of the invention, in which:

FIG. 2A depicts a cross-sectional view of the nFET region and the pFET region of the substrate/wafer showing the results of initial fabrication operations according to embodiments of the invention;

FIG. 3 depicts a cross-sectional view of the nFET region of the substrate/wafer showing the results of fabrication operations according to embodiments of the invention;

FIG. 4 depicts a cross-sectional view of the nFET region of the substrate/wafer showing the results of fabrication operations according to embodiments of the invention;

FIG. 5 depicts a cross-sectional view of the nFET region of the substrate/wafer showing the results of fabrication operations according to embodiments of the invention;

FIG. 6 depicts a cross-sectional view of the nFET region of the substrate/wafer showing the results of fabrication operations according to embodiments of the invention;

FIG. 7 depicts a cross-sectional view of the nFET region of the substrate/wafer showing the results of fabrication operations according to embodiments of the invention;

FIG. 8 depicts a cross-sectional view of the nFET region of the substrate/wafer showing the results of fabrication operations according to embodiments of the invention;

FIG. 9 depicts a cross-sectional view of the nFET region of the substrate/wafer showing the results of fabrication operations according to embodiments of the invention;

FIG. 10 depicts a cross-sectional view of the nFET region of the substrate/wafer showing the results of fabrication operations according to embodiments of the invention;

FIG. 11 depicts a cross-sectional view of the nFET region of the substrate/wafer showing the results of fabrication operations according to embodiments of the invention;

FIG. 12 depicts a cross-sectional view of the nFET region of the substrate/wafer showing the results of fabrication operations according to embodiments of the invention;

FIG. 13 depicts a cross-sectional view of the nFET region and the pFET region of the substrate/wafer showing the results of fabrication operations according to embodiments of the invention.

DETAILED DESCRIPTION

Although this specification includes a detailed description of an exemplary FinFET non-planar MOSFET device architecture, implementation of the teachings recited herein are not limited to a particular type of MOSFET device or integrated circuit (IC) architecture. Rather, embodiments of the present invention are capable of being implemented in conjunction with any other type of planar or non-planar transistor device or IC architecture, now known or later developed, for which there is a need to form a conductive contact to a source or drain (S/D) of the transistor device.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 1:
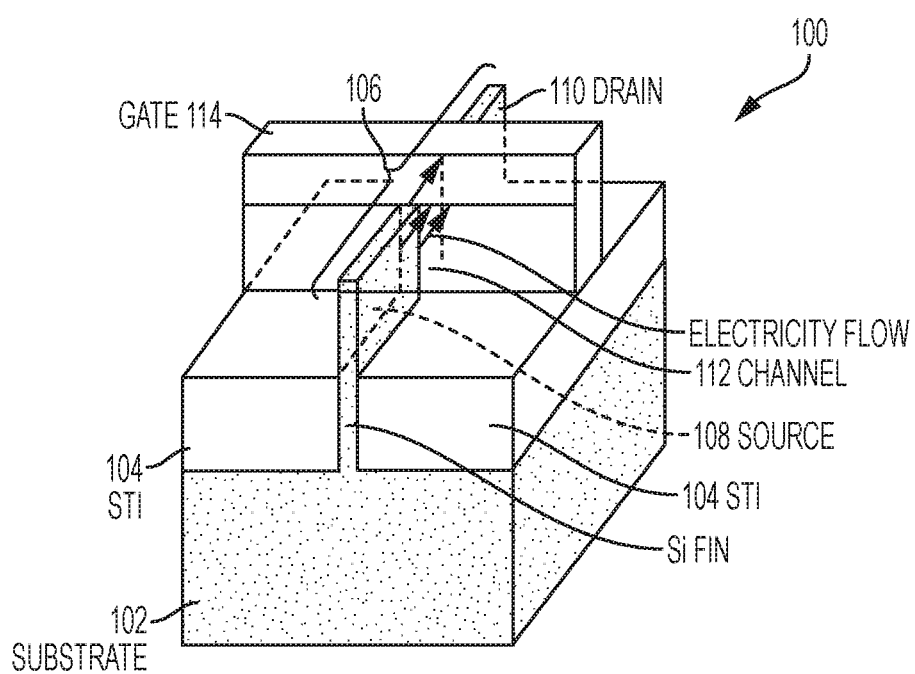
FIG. 1 depicts a three-dimensional view of a known FinFET device architecture.

Turning now to an overview of technologies that are more specifically relevant to aspects of the invention, a typical wafer fabrication process applies a series of complex steps to a semiconductor wafer to define conductors, transistors, resistors, and other electronic components on the semiconductor wafer. Transistors are formed in a variety of configurations. For example, FinFETs are non-planar transistor architectures that employ semiconductor fins and a gate structure wrapped around the fin sidewalls. To illustrate the non-planar architecture of FinFETs, a three-dimensional view of a known FinFET 100 is shown in FIG. 1. The basic electrical layout and mode of operation of FinFET 100 do not differ significantly from a traditional FET. FinFET 100 includes a semiconductor substrate 102, shallow trench isolation (STI) layers 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin 106 is shown in FIG. 1. In practice, FinFET devices can be fabricated having multiple fins formed on STI 104 and substrate 102. Substrate 102 can be silicon, STI 104 can be an oxide (e.g., silicon oxide), and the fin 106 can be silicon that has been enriched to a desired concentration level of germanium. The gate 114 controls the source to drain current flow (labeled ELECTRICITY FLOW in FIG. 1).

In contrast to planar MOSFETs, source 108, drain 110 and channel 112 of the FinFET 100 are formed from the fin 106, which is built as a three-dimensional bar on top of the semiconductor substrate 102. The fin 106 extends through the STI layer 104 and serves as the body of the device. The gate electrode 114 is then wrapped over the top and sides of a central portion of the fin 106. The central portion of the fin functions as the channel 112. The source and drain regions 108, 110 are the portions of the fin 106 on either side of the channel 112 that are not under the gate electrode 114.

In some FinFET architectures, raised source/drain (S/D) regions (not shown in FIG. 1) can be epitaxially grown over the S/D portions 108, 110 of the fin 106 to increase the S/D volume and provide a larger surface for interfacing S/D conductive contacts (not shown in FIG. 1) with the raised S/D region. The S/D contacts are formed on either side of the gate structure 114, which includes a conductive gate material (e.g., tungsten (W), aluminum (Al), and the like), which is bound at its lower portion by a dielectric liner (not shown). The FET can be a FinFET, a planar FET, a nanowire FET, a nanosheet FET, a vertical FET (VFET), etc.

Transistors and interconnects are the two main structures of an IC. The transistors typically reside on or near the bottom level/layer of the IC structure. Several levels are above the transistor level including, for example, one or more interconnect levels (i.e., signal wiring) that transmit signals and power throughout the IC. The transistors are communicatively coupled to the closest interconnect level by conductive contacts. An IC can have, for example, millions of transistors, billions of contacts, and 10-15 interconnect levels/layer.

Contact resistance is an important performance parameter for transistors. Contact resistance can be generally defined as the contribution to the transistor's total resistance that can be attributed to the contacts, and more specifically, to the interfaces between the contacts and the conductive terminals of the transistor (e.g., the S/D regions). Contact resistance can be contrasted with the transistor's intrinsic resistance, which is an inherent property based on specific transistor features (e.g., dimensions, materials, and the like). Many factors impact contact resistance, including for example, the contact's size/shape, the area of the contact-to-S/D interface, the contact material, and whether the transistor is n-type or p-type. Because unwanted contact resistance slows transistors down, it is, in general, desirable to reduce contact resistance, or maintain it within a predetermined range such that the transistor can achieve its performance targets.

In known MOSFET architectures (e.g., FinFETs, VFETs, etc.), S/D contacts can be fabricated by forming a S/D contact trench over the surface of the S/D region where the S/D contact will interface. For example, in a FinFET architecture, the S/D contact trench can be defined by the top surface of the S/D region and the gate sidewalls that extend above and on opposite sides of the S/D region. During typical fabrication operations that occur prior to contact formation, the S/D contact trench is filled with a protective material. For example, a silicon nitride liner can be deposited over the trench sidewalls, and the remaining volume of the S/D contact trench is filled with silicon oxide. To form the S/D contact, a mask is used to open the contact trench, thereby removing the silicon oxide (e.g., by directional etch such as reactive ion etch (RIE)) from the contact trench as the silicon nitride liner protects S/D during oxide RIE process. A second RIE process is then performed to remove silicon nitride liner from the top of the S/D. A conductive material is then deposition on top of the exposed S/D to form contact. Note that in such a prior art process flow, the silicon nitride liner remains on trench sidewalls, thus shrinking the contact trench volume/size that is available for the metal contact. The smaller the contact trench, the higher the contact resistance. In contrast, and as explained in greater detail subsequently herein, embodiments of the invention do not need the silicon nitride liner, thus effectively increasing the contact trench volume/size and reducing the contact resistance in comparison with known approaches.

Figure 2A:
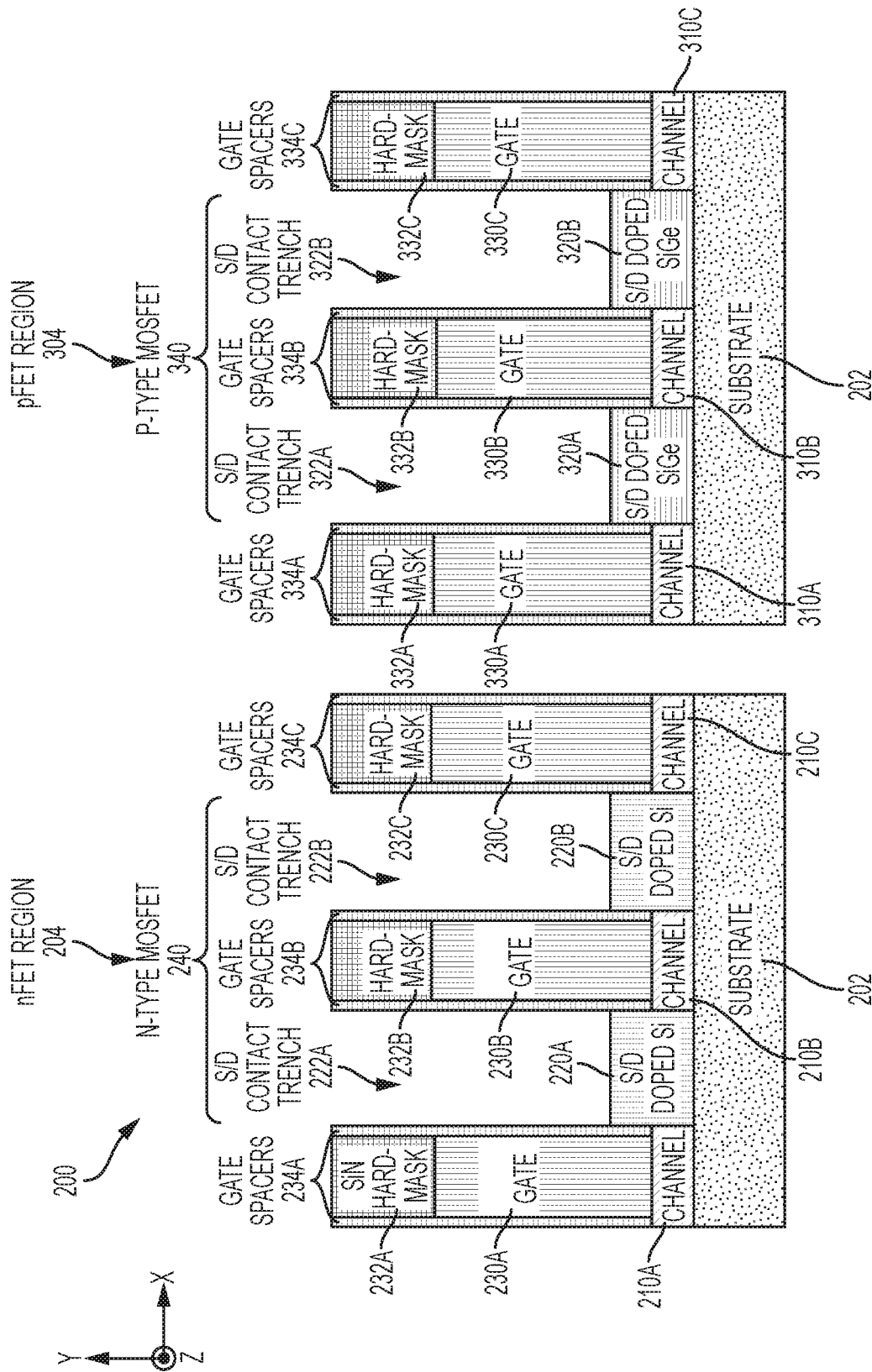
Figure 2B:
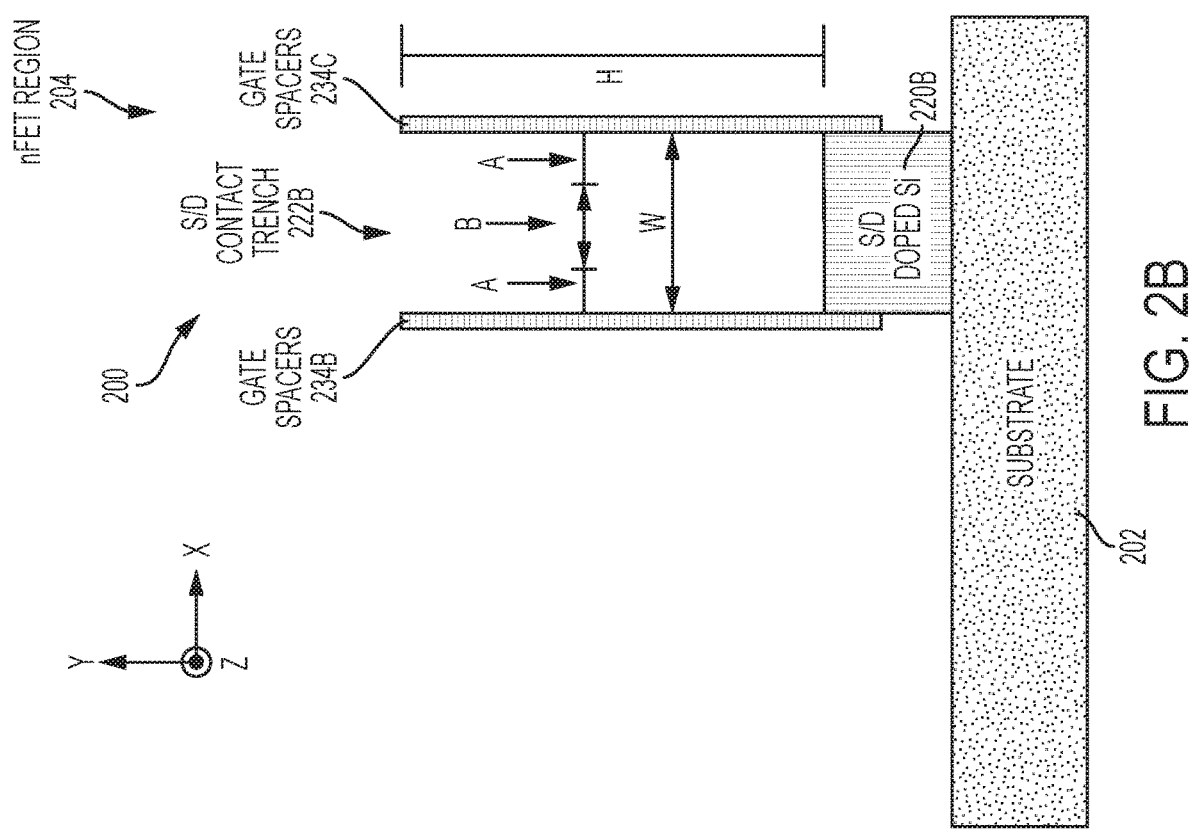
FIG. 2B depicts a cross-sectional view showing the dimensions of the high aspect ratio source/drain (S/D) contact trench of the nFET region shown in FIG. 2A.

The dimensions of a high aspect-ratio S/D contact trench are illustrated by a S/D contact trench 222B shown in FIG. 2B. The structures surrounding the S/D contact trench 222B are shown in FIG. 2A, and the details of the structures shown in FIGS. 2A and 2B are described in greater detail subsequently herein. FIG. 2B is referenced here for purposes of introducing the space constraints that result from reducing the transistor foot print by forming increasingly higher aspect-ratio S/D contacts. As shown in FIG. 2B, the S/D contact trench 222B is defined by a top surface of a doped-silicon (Si) S/D region 220B and inner sidewalls of gate spacers 234B and 234C. The dimensions of the S/D contact trench 220B are defined by a height dimension (H), a width dimension (W), and a Z dimension (shown by the X/Y/Z diagram). The portion of the S/D contact trench 222B that is allocated to the liners (e.g., the uniform etch stop layer) is defined by the height dimension H, the width dimensions A, and the Z dimension. Accordingly, after forming the necessary liners, the remaining space in the S/D contract trench 222B for forming a S/D contact (e.g., S/D contact 1302A shown in FIG. 13) is defined by the height dimension H, the width dimension B, and the Z dimension.

As MOSFET dimensions continue to decrease, the dimensions allocated to the S/D contact trench decrease as well. More specifically, to reduce MOSFET footprints, higher aspect-ratio MOSFET features are utilized. For example, referring still to the S/D contact trench 222B in FIG. 2B, in a typical FinFET MOSFET architecture, H can be about 100 nm, W can be about 15 nm, and the etch stop liner can be about 5 nm. In this example, only about 5 nm of width is left for forming both the uniform etch stop layer and the S/D contact. The reduced space in the S/D contact trench 222B for forming the S/D contact puts additional pressure on known semiconductor device fabrication processes and results in the formation of taller and narrower high aspect-ratio S/D contacts. As S/D contacts become taller and narrower, the SD contact's contact resistance is driven continuously higher. If the S/D contact resistance falls in a certain range, device performance will be degraded. Removing the etch stop liners from trench sidewalls to enlarge the contact trench size requires an isotropic etch process that would undesirably create undercutting of etch stop liner in other areas and consequently create yield problem.

Turning now to an overview of aspects of the invention, embodiments of the invention address the above-described shortcomings of the prior art by providing fabrication methods and resulting structures for self-limiting liners configured and arranged to increase the portion of the contact trench volume that is available for forming the contact therein. With more of the contact trench's volume available for the contact, a larger contact can be formed, which decreases contact resistance and facilitates the use of different types of conductive contact material in the n-type and p-type transistors on the wafer. The n-type transistor conductive contact material can be selected based at least in part on its ability to reduce contact resistance in an n-type transistor environment (e.g., where the S/D region is doped to perform as an n-type S/D region). The p-type transistor conductive contact material can be selected based at least in part on its ability to reduce contact resistance in a p-type transistor environment (e.g., where the S/D region is doped to perform as a p-type S/D region). Accordingly, aspects of the invention facilitate controlling or tuning n-type transistor contact resistance independently from p-type transistor contact resistance.

In embodiments of the invention, the self-limiting liner is an etch stop liner that is fabricated in a novel manner that limits the formation of the etch stop liner to the region or surface where the etch stop liner is needed. Because the etch stop liner is not on portions of the contact trench where protection is not needed (e.g., along the trench sidewalls), more lateral space in the contact trench can be allocated to the contact, which allows for the formation of a wider contact, thereby improving contact resistance and facilitating the use of different types of conductive contact material in the n-type and p-type transistors on the wafer.

Aspects of the invention can be applied to planar or non-planar MOSFET architectures (e.g., FinFETs, VFETs, etc.). For example, aspects of the invention can be applied to an n-type FinFET architecture having a S/D region formed from a doped first type of semiconductor material (e.g., Si). A S/D contact trench of the FinFET is the space over the S/D region in which the S/D contact will be formed. Thus, the S/D contact trench can be defined by the top surface of the S/D region and the gate sidewalls that extend above and on opposite sides of the S/D region top surface. During the operations for fabricating the FinFET, a protective material (e.g., aSi) can be formed in the S/D contact trench prior to forming the actual S/D contact therein. The protective material must be removed from the S/D contact trench prior to forming the S/D contact. Accordingly, an etch stop layer can be formed in accordance with aspects of the invention over the top surface of the S/D region in order to protect the S/D region from damage when the protective material is removed to open up the S/D contact trench. The etch stop layer can be formed according to aspects of the invention as a self-limiting liner that is fabricated in a manner that limits the formation of the etch stop liner to the top surface of the S/D region where the etch stop liner is needed. Because the etch stop liner formed in accordance with aspects of the invention is not formed along the gate sidewalls, more lateral space in the S/D contact trench can be allocated to the S/D contact, which allows for the formation of a wider S/D contact, thereby improving contact resistance and facilitating the use of different types of conductive contact material in the n-type and p-type transistors on the wafer.

In embodiments of the invention, the etch stop liner is formed in the S/D contact trench prior to depositing the protective material. The etch stop liner according to aspects of the invention is self-limiting in that it is formed according to a process that leverages a controlled chemical reaction. The novel etch stop fabrication process can include forming a layer of material over a top surface of the doped S/D region. The doped S/D region is formed from a doped first type of semiconductor material (e.g., Si), and the deposited layer of material is formed from a combination of the first type of semiconductor material (e.g., Si) and a second type of semiconductor material (e.g., germanium (Ge)). In embodiments of the invention, the layer of SiGe material can be deposited or formed using an epitaxial growth process. Using an epitaxially growth process, the layer of SiGe material can be grown from the top surface of the doped Si S/D region, which substantially confines the layer of SiGe material top surface of the doped Si S/D region where the etch stop protection will be needed. In some embodiments of the invention, the layer of SiGe material is grown during a S/D epitaxy process (i.e., after S/D epitaxy, continue the epitaxy process to grow SiGe layer). Therefore, no additional process is needed. Another layer that includes an oxide of the second type of semiconductor material (e.g., a layer of $GeO_2$) is deposited within the S/D contact trench, and more specifically over the SiGe layer and along sidewalls of the gate spacers that extend above and on opposite sides of the S/D region. $GeO_2$ can be deposited by atomic layer deposition (ALD), chemical vapor deposition (CVD), or any other suitable deposition technique.

The controlled chemical reaction according to aspects of the invention is facilitated by applying at least one anneal operation to the $GeO_2$ layer and the SiGe layer, wherein the at least one anneal operation is sufficient to result in the portion of the $GeO_2$ layer that is over the SiGe layer interacting with the SiGe layer to begin converting that portion of the $GeO_2$ layer to $SiO_2$. In some embodiments of the invention, the at least one anneal operation includes a first anneal at a first predetermined temperature (e.g., about 700 Celsius) in an inert gas environment (e.g., nitrogen, argon, helium, neon, hydrogen). In embodiments of the invention, a second anneal at a second predetermined temperature/environment can be applied, wherein the second predetermined temperature is less than the first predetermined temperature, and wherein the environment is also an inert gas (e.g., nitrogen, argon, helium, neon, hydrogen).

Figure 14:
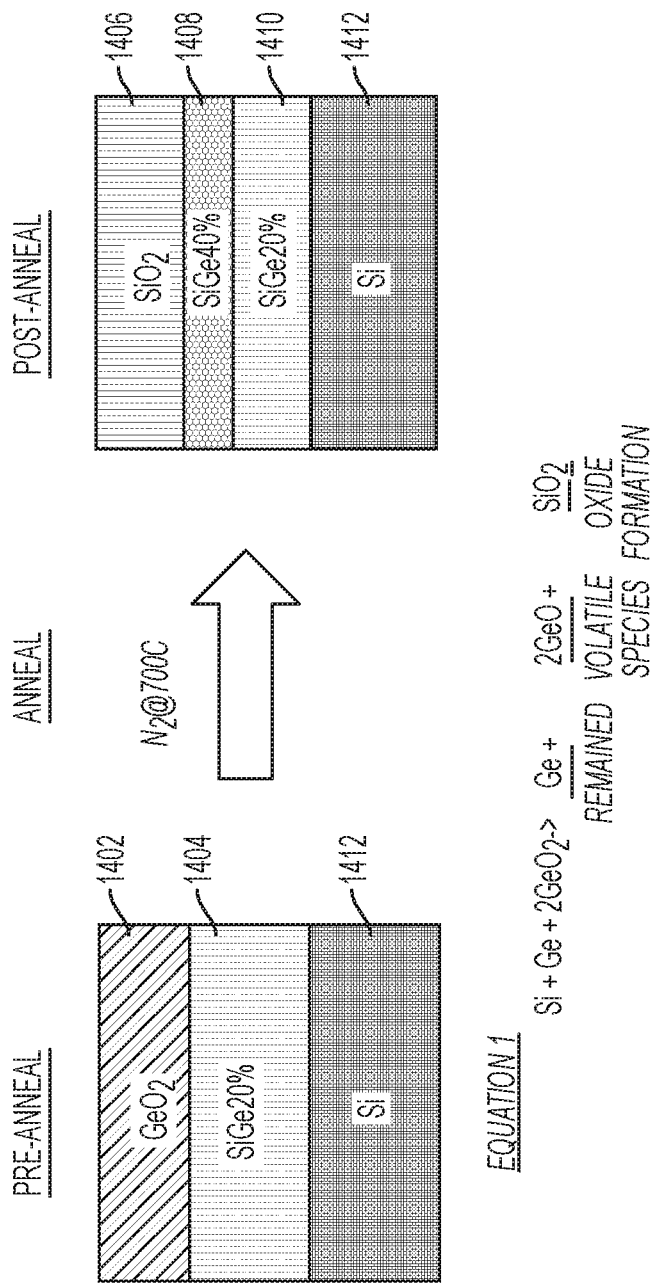
FIG. 14 depicts a diagram illustrating the selective formation of a silicon dioxide layer from an anneal-driven reaction between germanium dioxide and silicon germanium according to embodiments of the invention.

FIG. 14 depicts a diagram illustrating an example of the above-described selective formation of a $SiO_2$ layer from an anneal-driven reaction between $GeO_2$ and SiGe. As shown in FIG. 14, the pre-anneal structure is a $GeO_2$ layer 1402 over a SiGe 20% layer 1404, which is over a Si layer 1412. The notation "SiGe20%" indicates that the SiGe material contains 20% Ge and 80% Si. The post-anneal structure is a $SiO_2$ layer 1406 over a SiGe40% layer 1408, which is over a SiGe 20% layer 1410. The SiGe 20% layer 1410 is over the Si layer 1412.

The anneal reaction proceeds according to Equation 1 shown in FIG. 14. The $GeO_2$ layer 1402 will react with the SiGe 20% layer 1404, thus leading to a condensation of Ge and converting the $GeO_2$ layer 1402 to $SiO_2$, thereby forming the $SiO_2$ layer 1406. As the reaction proceeds, more Si in the SiGe20% layer 1404 is oxidized to $SiO_2$, and the surface of the SiGe20% layer 1404 is continuously enriched with additional Ge. The additional Ge flowing into the SiGe20% layer 1404 leads to a condensation of Ge that spreads inward from the surface interface between the layers 1402, 1404. As the reaction proceeds, and the Ge concentration in the SiGe layer 1408 continues to increase until the desired ratios are reached.

In embodiments of the invention, the self-limiting etch stop layer formation process can be well-controlled, as the reaction of $GeO_2$ with the SiGe only occurs during the anneal, which can, in some embodiments be a spike anneal at a temperature from about 500-700 degrees Celsius. The selective $SiO_2$ formation in this manner is self-limited and will continue until either all of the $GeO_2$ is consumed or the SiGe surface becomes sufficiently enriched with germanium that the Equation 1 reaction cannot proceed. For example, if a relatively thick $GeO_2$ layer is used, the reaction will stop when available Si atoms are not enough at the SiGe surface. Consequently, the severity of the self-limiting etch stop layer formation process can be tuned by adjusting the thickness of the $GeO_2$ layer that has been deposited on the SiGe layer, or by adjusting the anneal temperature/duration.

The gate spacers that define a portion of the S/D contact trench are formed from a material (e.g., SiN) that does not react with $GeO_2$. Accordingly, the annealing method of the present invention is highly selective to SiGe, and, after the necessary reactions shown in Equation 1 have completed, the unreacted $GeO_2$ in the can be easily removed by exposing it to a water containing wash because $GeO_2$ is water soluble.

Turning now to a more detailed description of aspects of the present invention, FIG. 2A depicts a semiconductor structure 200 after initial fabrication stages according to embodiments of the invention. Known fabrication operations have been used to form the semiconductor structure 200 shown in FIG. 2A. A variety of fabrication operations are suitable for fabricating the semiconductor structure 200 to the stage shown in FIG. 2A. Because the fabrication operations are well-known, they have been omitted in the interest of brevity. In embodiments of the invention, the structure 200 will be, after completion of the fabrication processes, a group of in-series n-type MOSFETs (e.g., n-type MOSFET 240) formed in an nFET region 204 of a Si wafer/substrate 202, along with a group of in-series p-type MOSFETs (e.g., p-type MOSFET 340) formed in a pFET region 304 of the Si wafer/substrate 202. In the example depicted in FIG. 2A, the n-type MOSFET 240 and the p-type MOSFET 340 are FinFET architectures having doped Si raised S/D regions 220A, 220B, 320A, 320B. However, as previously noted herein, embodiments of the invention are not limited to a particular type of MOSFET device or IC architecture. Rather, embodiments of the invention are capable of being implemented in conjunction with any type of planar or non-planar transistor device or IC architecture, now known or later developed, for which there is a need to form a conductive contact to a S/D of the transistor device.

In the nFET region 204 of the substrate 202, the n-type MOSFET 240 includes a Si channel region 210B (which can be lightly doped or undoped), doped-Si S/D regions 220A, 220B, a gate 230B, a hardmask 232B, and gate spacers 234B, configured and arranged as shown. To the left of the n-type MOSFET 240 are a Si channel 210A (which can be slightly doped or lightly doped), a gate 230A, a hardmask 232A, and gate spacers 234A, configured and arranged as shown. In the embodiment of the invention depicted in FIG. 2A, the n-type MOSFET 240 shares the S/D region 220A with a first in-series n-type MOSFET that is in series with the n-type MOSFET 240 and is formed from a Si channel 210A, a gate 230A, a hardmask 232A, gate spacers 234A, and another doped-Si S/D region (not shown) adjacent to and communicatively coupled with the channel region 210A. To the right of the n-type MOSFET 240 are a Si channel 210C (which can be lightly doped), a gate 230C, a hardmask 232C, and gate spacers 234C, configured and arranged as shown. In the embodiment of the invention depicted in FIG. 2A, the n-type MOSFET 240 shares the S/D region 220B with a second in-series n-type MOSFET that is in series with the n-type MOSFET 240 and is formed from a Si channel 210C (which can be lightly doped), a gate 230C, a hardmask 232C, gate spacers 234C, and another doped Si S/D region (not shown) adjacent to and communicatively coupled with the channel region 210C. A first S/D contact trench 222A is defined by a top surface of the S/D region 220A and sidewalls of the gate spacers 234A, 234B. A second S/D contact trench 222B is defined by a top surface of the S/D region 220B and sidewalls of the gate spacers 234B, 234C.

Similarly, in the pFET region 304 of the substrate 202, the p-type MOSFET 340 includes a Si channel region 310B (which can be lightly doped), doped-SiGe S/D regions 320A, 320B, a gate 330B, a hardmask 332B, and gate spacers 334B, configured and arranged as shown. To the left of the p-type MOSFET 340 are a Si channel 310A (which can be slightly doped), a gate 330A, a hardmask 332A, and gate spacers 334A, configured and arranged as shown. In the embodiment of the invention depicted in FIG. 2A, the p-type MOSFET 340 shares the S/D region 320A with a first in-series p-type MOSFET that is in series with the p-type MOSFET 340 and is formed from a Si channel 310A (which can be lightly doped or undoped), a gate 330A, a hardmask 332A, gate spacers 334A, and another doped SiGe S/D region (not shown) adjacent to and communicatively coupled with the channel region 310A. To the right of the p-type MOSFET 340 are a Si channel 310C (which can be lightly doped), a gate 330C, a hardmask 332C, and gate spacers 334C, configured and arranged as shown. In the embodiment of the invention depicted in FIG. 2A, the p-type MOSFET 340 shares the S/D region 320B with a second in-series p-type MOSFET that is in series with the p-type MOSFET 340 and is formed from a Si channel 310C, a gate 330C, a hardmask 332C, gate spacers 334C, and another doped SiGe S/D region (not shown) adjacent to and communicatively coupled with the channel region 310C. A first high aspect-ratio S/D contact trench 322A is defined by a top surface of the S/D region 320A and sidewalls of the gate spacers 334A, 334B. A second high aspect-ratio S/D contact trench 322B is defined by a top surface of the S/D region 320B and sidewalls of the gate spacers 334B, 334C. The n-type MOSFET 240 and the p-type MOSFET 340 can have the same channel material (e.g., Si). Alternatively, the n-type MOSFET 240 and the p-type MOSFET 340 can have different channel material (e.g., n-type MOSFET 240 has Si channels, and p-type MOSFET 340 has SiGe channels).

The gates 230A, 230B, 230C, 330A, 330B, 330C can be dummy gates, for example, including a dummy gate oxide and a dummy gate placeholder such as amorphous silicon or polycrystalline silicon. Dummy gates can be replaced with final gate structures such as a high-k gate dielectric and a metal gate. Alternatively, the gates 230A, 230B, 230C, 330A, 330B, 330C can be final gate structures that include a high-k gate dielectric and a metal gate or any other suitable gate materials.

In general, gate dielectrics can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium.

In general, the gate conductor can include any suitable conducting material. The conductive material can further include dopants that are incorporated during or after deposition. In some embodiments, the gate can further include a workfunction setting layer between the gate dielectric and gate conductor. The workfunction setting layer can be a workfunction metal (WFM). WFM can be any suitable material. In some embodiments of the invention, a conductive material or a combination of multiple conductive materials can serve as both gate conductor and WFM. The gate conductor and WFM can be formed by any suitable process or any suitable combination of multiple processes. In general, the gate spacer can include any suitable dielectric materials.

FIG. 2B illustrates the space constraints that result from reducing transistor foot print by forming the S/D contact trenches 222A, 222B, 322A, 322B (shown in FIG. 2A) to have increasingly higher aspect-ratios. The dimensions depicted in FIG. 2B for the S/D contact trench 222B apply equally to the S/D contact trenches 222A, 322A, 322B. As shown in FIG. 2B, the S/D contact trench 222B is defined by a top surface of the S/D region 220B and inner sidewalls of gate spacers 234B and 234C. The dimensions of the S/D contact trench 220B are defined by a height dimension (H), a width dimension (W), and a Z dimension (shown by the X/Y/Z diagram). The portion of the S/D contact trench 222B that is allocated to the required liner (i.e., the contact liner 1202 shown in FIG. 12) is defined by the height dimension H, the width dimensions A, and the Z dimension. In accordance with aspects of the invention, after forming a contact liner 1202 (shown in FIG. 12), the remaining space in the S/D contract trench 222B for forming the S/D contact 1302A (shown in FIG. 13) is defined by the height dimension H, the width dimension B, and the Z dimension.

Referring still to the S/D contact trench 222B in FIG. 2B, in a typical FinFET MOSFET architecture, H can be about 100 nm, W can be about 15 nm, and the contact liner 1202 (shown in FIG. 12) can be about 5 nm. In this example, about 5 nm of width is left for forming the S/D contact 1302A, and the available volume of the S/D contact trench 222B is increased because, in accordance with aspects of the invention, none of the volume of the S/D contact trench 222B is allocated to an etch stop liner. The increase in available space in the S/D contact trench 222B enables the formation of relatively wider high aspect-ratio S/D contacts. In embodiments of the invention, a novel self-limiting liner is utilized to increase the portion of the S/D contact trench volume that is available for forming the contact therein. With more of the S/D contact trench's volume available for the contact, a larger contact can be formed, which decreases contact resistance and facilitates the use of different types of conductive contact material in the n-type and p-type transistors on the wafer. The n-type transistor conductive contact material (e.g., S/D contact 1302A shown in FIG. 13) can be selected based at least in part on its ability to reduce contact resistance in an n-type transistor environment. The p-type transistor conductive contact material (e.g., S/D contact 1302B shown in FIG. 13) can be selected based at least in part on its ability to reduce contact resistance in a p-type transistor environment. Accordingly, aspects of the invention, and specifically the increase in available S/D contact trench volume, facilitate controlling or tuning n-type transistor contact resistance independently from p-type transistor contact resistance.

In embodiments of the invention, the self-limiting liner is an etch stop liner (e.g., SiO$_2$ layer 502 and SiGe layer 224A' shown in FIG. 5), which is fabricated in a novel manner that limits the formation of the etch stop liner to the region or surface (e.g., the top surfaces of the S/D regions 220A, 220B) where the etch stop liner is needed. Because the etch stop liner is not on portions of the contact trench where protection is not needed (e.g., along sidewalls of the gate spacers 234B, 234C), more lateral space in the S/D contact trench 222B can be allocated to the S/D contact (e.g., S/D contact 1302A shown in FIG. 13), which allows for the formation of a wider S/D contact, thereby improving (i.e., reducing) contact resistance and facilitating the use of different types of conductive contact material in the n-type and p-type transistors on the wafer.

FIGS. 3-12 depict the result of various fabrication operations applied to the semiconductor structure 200 for forming self-limiting etch stop liners (e.g., SiO2 layer 502 and SiGe layer 224A' shown in FIG. 5) in the S/D contact trenches 222A, 222B in accordance with aspects of the invention. FIGS. 3-12 describe fabrication operations applied to the nFET region 204 of the substrate 202. However, substantially the same fabrication operations can be applied to the semiconductor structure 200 for forming self-limiting etch stop liners (e.g., SiO2 layer 502A' shown in FIG. 13) in the S/D contact trenches 322A, 322B of the pFET region 304 of the substrate 202. Because the S/D regions 320A, 320B of the p-type MOSFET 340 are formed from SiGe, depositing SiGe layers corresponding to the SiGe layers 224A, 224B can, optionally, be omitted.

Figures 3, 4:
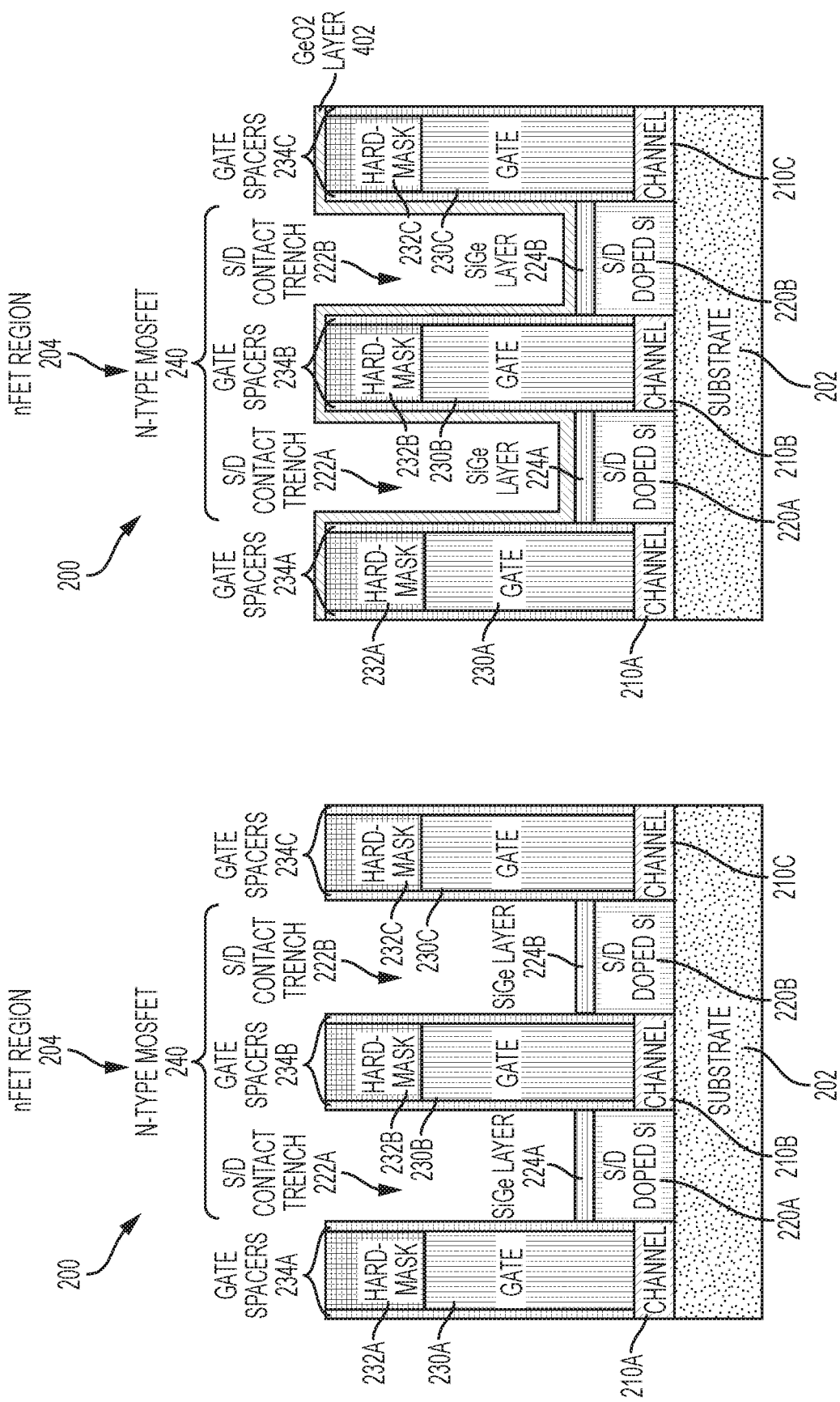

In FIG. 3, known fabrication operations have been used to form SiGe layers 224A, 224B over top surfaces of the doped-Si S/D regions 220A, 220B, respectively. In embodiments of the invention, the SiGe layers 224A, 224B can formed using an epitaxial growth process. Materials can be epitaxially grown from gaseous or liquid precursors using vapor-phase epitaxy (VPE), molecular-beam epitaxy (MBE), liquid-phase epitaxy (LPE), or other suitable process. In some embodiments, the SiGe layers 224A and 224B are formed during the source/drain epitaxy process (i.e., SiGe layers on top of n-type MOSFET are grown after growing the n-type source/drain, and SiGe layers on top of p-type MOSFET are grown after growing the p-type source/drain). Alternatively, the SiGe layers can be grown by a dedicated epitaxy process, i.e., SiGe layers are grown on top of both n-type source/drain and p-type source/drain after the formation of both n-type source/drain and p-type source/drain. The SiGe 224A and 224B layers can be doped or undoped.

In FIG. 4, known fabrication processes (e.g., an atomic layer deposition (ALD)) have been used to conformally deposit a layer 402 formed from a material that includes an oxide of Ge (e.g., GeO$_2$). The GeO$_2$ layer 402 is conformally deposited over the semiconductor structure 200 to cover the SiGe layers 224A, 224B and sidewalls of the gate spacers 234A, 234B, 234C of the S/D contact trenches 222A, 222B. A non-limiting example range for the GeO$_2$ thickness is 2-6 nm.

Figure 5:
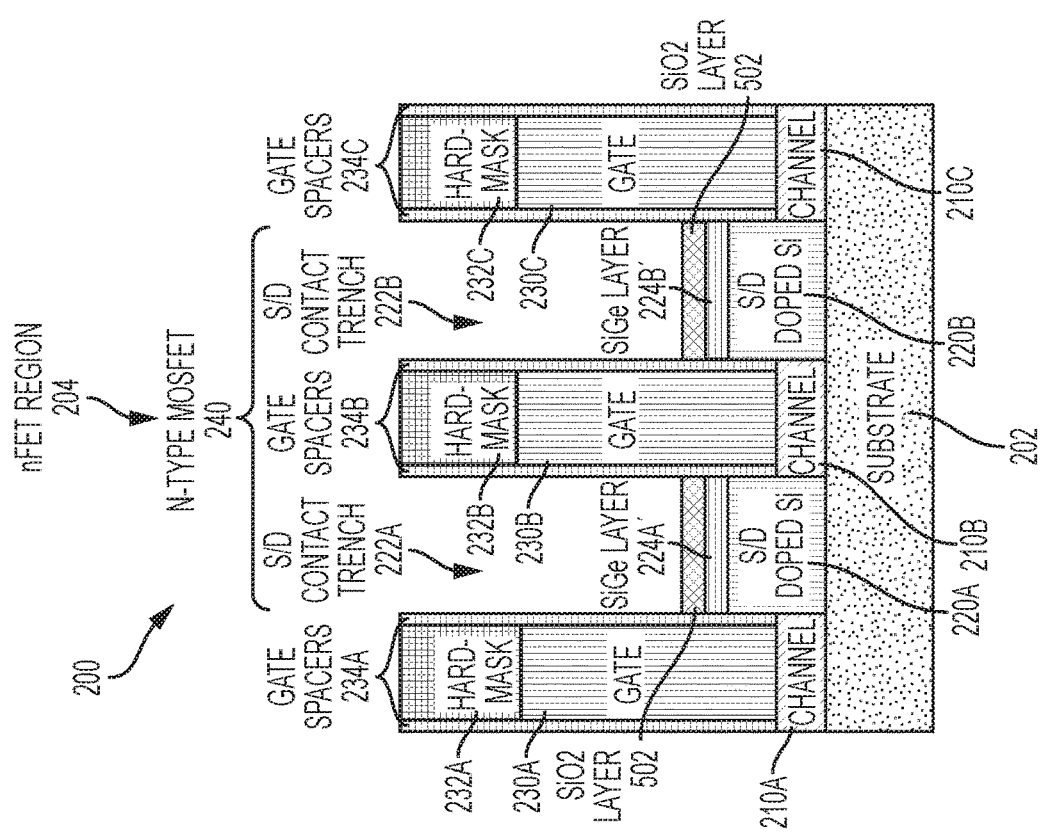

In FIG. 5, at least one anneal operation has been applied to the GeO$_2$ layer 402 (shown in FIG. 4) and the SiGe layers 224A, 224B (shown in FIG. 4) to enable a reaction that forms SiO$_2$ layers 502 and SiGe layers 224A', 224B that each have a different Ge concentration than the SiGe layers 224A, 224B, respectively. The at least one anneal operation is sufficient to result in the GeO$_2$ layer 402 and the SiGe layers 224A, 224B interacting (or reacting) to convert the portions of the GeO$_2$ layer 402 that are over the SiGe layers 224A, 224B to the SiO$_2$ layers 502. Concurrently, the at least one anneal operation is sufficient to result in Ge diffusing from the original GeO$_2$ layer 402 into the SiGe layers 224A, 224B to increase the Ge concentrations thereof and form the of the SiGe layers 224A', 224B'. In some embodiments of the invention, the at least one anneal operation includes a first anneal at a first predetermined temperature (e.g., a spike anneal at about 700 degrees Celsius) in a nitrogen ambient. In embodiments of the invention, the at least one anneal operation can further include a second anneal at a second predetermined temperature (e.g., about 450 degrees Celsius) in a nitrogen ambient, wherein the second predetermined temperature is less than the first predetermined temperature. Additional details of the above-described reaction are depicted in FIG. 14 and were previously described in this detailed description. Any inert environment (e.g., nitrogen, argon, helium, neon) can be used in the anneal.

As also shown in FIG. 5, subsequent to the above-described anneal(s), the unreacted portions of the GeO$_2$ layer 402 (shown in FIG. 4) have been removed by exposing the unreacted portions of the GeO$_2$ layer 402 to a water containing wash because GeO$_2$ is water soluble. In areas other than where it is desired to form the SiO$_2$ layer 502, materials are used that do not substantially react with GeO$_2$ in the manner depicted by Equation 1 of FIG. 14. For example, the hardmasks 232A, 232B, 232C and the gate spacers 234A, 234B, 234C can be formed from a nitride (e.g., SiN).

Figure 6:
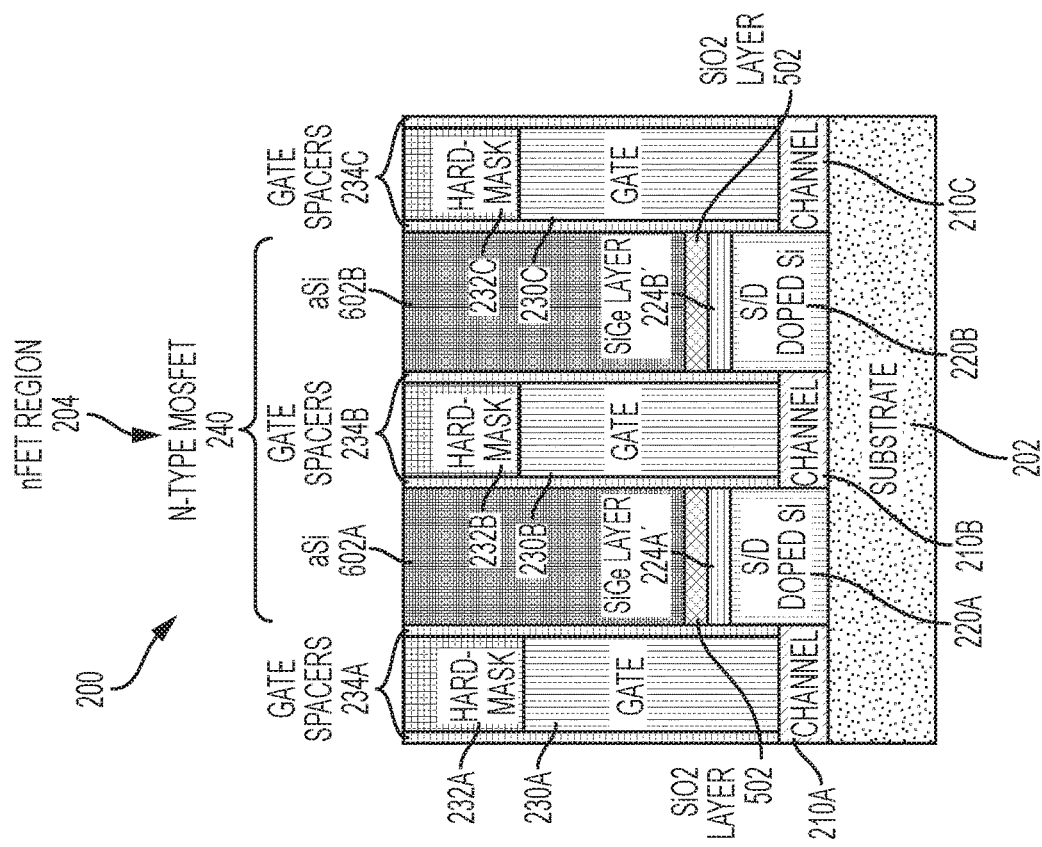

In FIG. 6, known fabrication operations have been used to deposit a protective material (e.g., amorphous Si (aSi)) 602A, 602B in the S/D contract trenches 222A, 222B (shown in FIG. 5). In embodiments of the invention, the protective material 602A is overfilled in the S/D contract trenches 222A, 222B then polished back (e.g., using chemical mechanical polishing (CMP)) to the level shown in FIG. 6. The purpose of aSi is to serve as a sacrificial filling material filling any gaps between gates. The SiO$_2$ is needed on top of the S/D epitaxy so that later the aSi can be removed without also attacking the S/D epitaxy. It is noted that the S/D epitaxy and aSi are all semiconductor materials so they have poor etch selectivity between each other. Subsequently, the aSi is removed in contact region and replaced with conducting contact materials. The aSi in non-contact trench region is then removed and replaced with a dielectric material or dielectric material(s). The advantage of having aSi as the sacrificial material is that it can be removed very selective to SiO$_2$. Therefore, even a thin SiO$_2$ layer, e.g., 3 nm, is sufficient to serve as an etch stop layer to protect the S/D epitaxy when removing aSi from the contact trench.

In FIG. 7, known semiconductor fabrication processes have been used to deposit a blocking mask 802 over the aSi 602B. In embodiments of the invention, the blocking mask 802 can be any suitable masking material, including but not limited to, photoresist, photoresist in conjunction with an organic planarization layer (OPL), or any suitable hardmask material. In general, OPLs are used to fill pre-existing features, and to planarize the substrate to allow for larger patterning process windows.

In FIG. 8, known semiconductor fabrication processes (e.g., a reactive ion etch (RIE)) have been used to remove the aSi 602A (shown in FIG. 7), thereby reopening the S/D contact trench 222A. In accordance with aspects of the invention, the SiO$_2$ layer 502 functions as an etch-stop layer that prevents the RIE that was used to remove the aSi 602A from also removing portions of the S/D region 220A, particularly where both the aSi 602A and the doped-Si S/D region 220A are formed from Si. SiO$_2$ also protects doped SiGe S/D in p-type MOSFET region.

Figure 9:
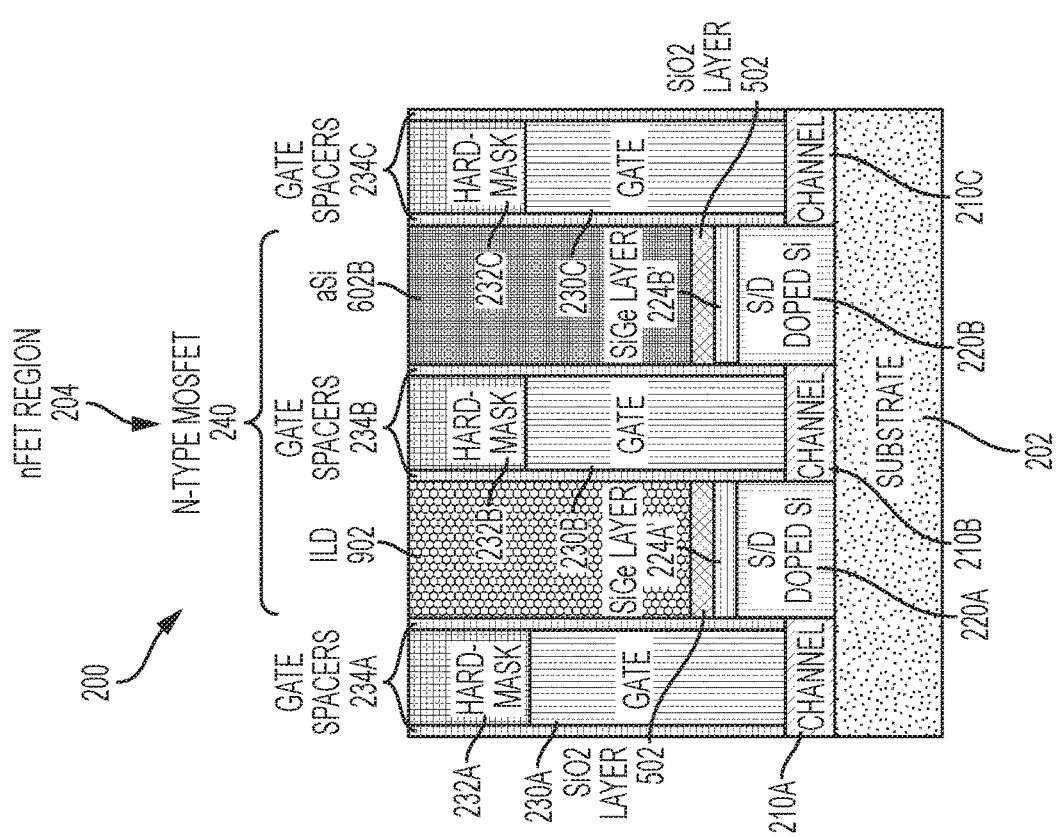

In FIG. 9, the blocking mask 802 (shown in FIG. 8) has been removed, and known semiconductor fabrication operations have been used to form a protective interlayer dielectric (ILD) region 902 in the S/D contact trench 222a (shown in FIG. 8). The ILD region (or dummy contact) 902 can be formed by depositing any suitable dielectric material or materials. For example, an oxide material such as spin-on-glass or flowable oxide can be used to fill the trenches. Planarization processes (e.g., using CMP) can be used to bring the ILD region 902 to the level of the gate spacers 234A, 234B and the hardmasks 232A, 232B. In some embodiments, the ILD 902 can further include a dielectric liner (e.g., silicon nitride) in the dummy contact sidewalls before filling the rest of the dummy contact trench with flowable oxide. The ILD region (or dummy contact) 902 is deposited in the S/D contact trench 222A because the series coupling of multiple instances of the n-type MOSFET 240, which was previously described herein, means that a conductive contact does not need to be made to every S/D region. In other cases, the ILD region 902 serves as the isolation between adjacent devices. In accordance with embodiments of the invention, each S/D contact trench that has been filled with a S/D conductive contact is adjacent a S/D contact trench that has been filled with a nonconductive material such as ILD 902.

More specifically, with respect to the series coupling of multiple instances of the n-type MOSFET 240, as previously described herein, to the left of the n-type MOSFET 240 are the Si channel 210A (which can be slightly doped), the gate 230A, the hardmask 232A, and gate spacers 234A, configured and arranged as shown. In the embodiment of the invention depicted in FIG. 9, the n-type MOSFET 240 shares the S/D region 220A with a first in-series n-type MOSFET that is in series with the n-type MOSFET 240 and is formed from the Si channel 210A (which can be lightly doped), the gate 230A, the hardmask 232A, gate spacers 234A, and another doped-Si S/D region (not shown) adjacent to and communicatively coupled with the channel region 210A. To the right of the n-type MOSFET 240 are the Si channel 210C (which can be lightly doped), the gate 230C, the hardmask 232C, and gate spacers 234C, configured and arranged as shown. In the embodiment of the invention depicted in FIG. 9, the n-type MOSFET 240 shares the S/D region 220B with a second in-series n-type MOSFET that is in series with the n-type MOSFET 240 and is formed from the Si channel 210C (which can be lightly doped), the gate 230C, the hardmask 232C, gate spacers 234C, and another doped Si S/D region (not shown) adjacent to and communicatively coupled with the channel region 210C. Because the ILD region 902 has been deposited in the S/D contact trench 222A, a conductive S/D contact will be formed over the S/D region of the in-series n-type MOSFET that is to the left of the n-type MOSFET 240. Because a conductive S/D contact 1302A (shown in FIG. 13) will be deposited in the S/D contact trench 222B (shown in FIG. 10), an ILD region similar to ILD region 902 will be formed over the S/D region of the in-series n-type MOSFET that is to the right of the n-type MOSFET 240.

Figure 10:
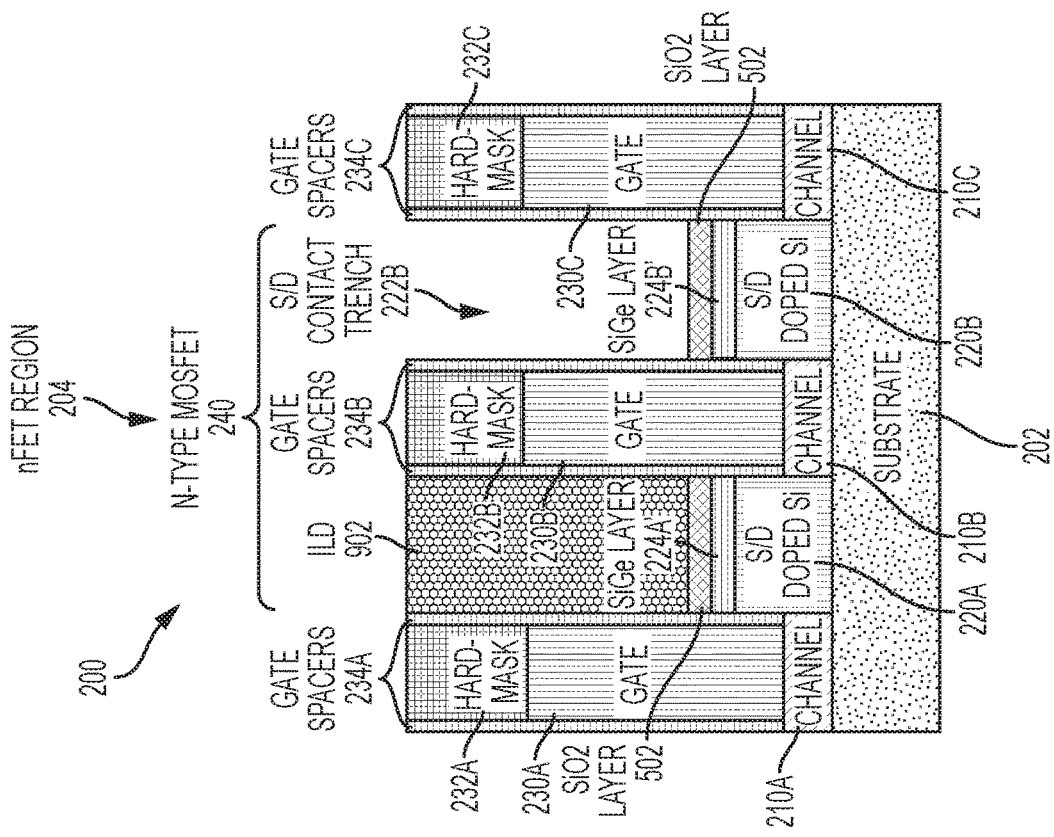

In FIG. 10, known semiconductor fabrication processes have been used to remove the aSi 602B (shown in FIG. 9), thereby reopening the S/D contact trench 222B. In embodiments of the invention, the known fabrication processes include a RIE process, a wet etch process such as ammonia etch, a silicon plasma etch, or a silicon dry etch. In embodiments of the invention, the etch can be isotropic or anisotropic. In embodiments of the invention, etch is isotropic so all remaining aSi in the contact trenches can be removed. In accordance with aspects of the invention, the $SiO_2$ layer 502 functions as an etch-stop layer that prevents the RIE that was used to remove the aSi 602B from also removing portions of the S/D region 220B.

Figure 11:
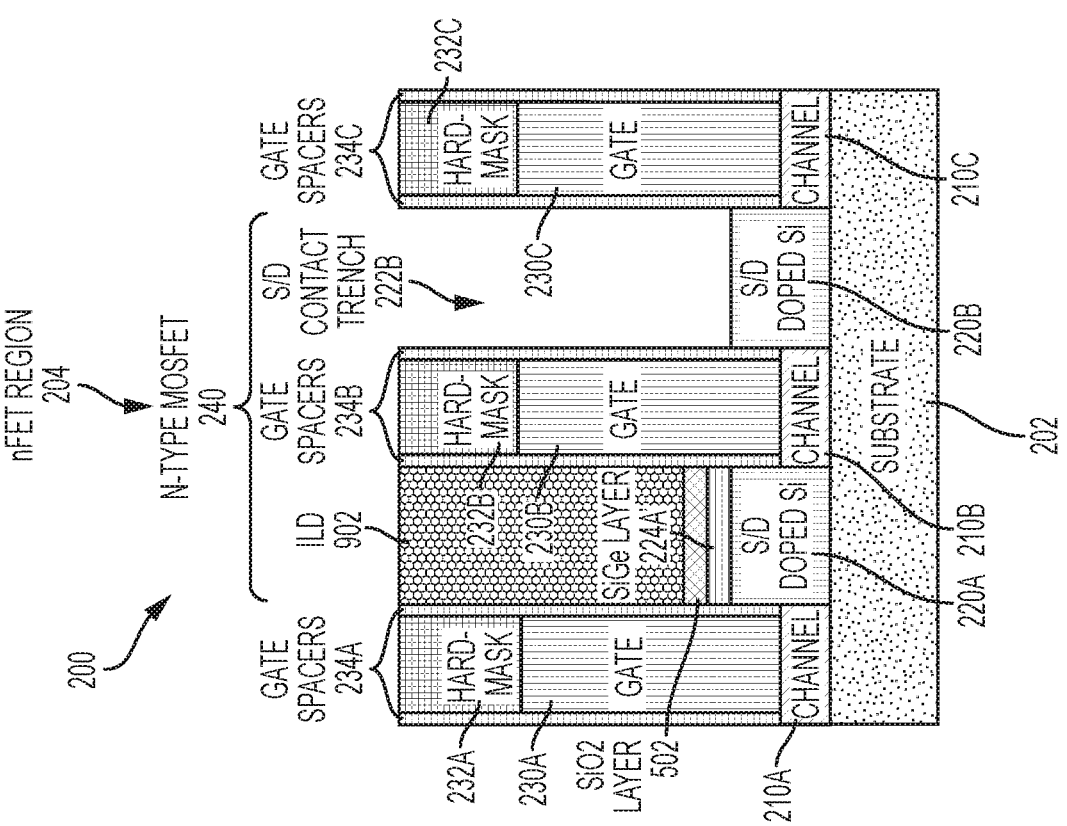

In FIG. 11, known semiconductor fabrication processes have been used to remove the $SiO_2$ layer 502 and the SiGe layer 224B' from over the S/D region 220B in the S/D contact trench 222B. In accordance with aspects of the invention, a pre-clean operation can be applied to the inner surfaces of the S/D contact trench 222B prior to depositing the contact liner 1202 (shown in FIG. 12), and the pre-clean operation can be configured and arranged to also remove the $SiO_2$ layer 502 and the SiGe layer 224B' from over the S/D region 220B in the S/D contact trench 222B. In some embodiment of the invention, a wet etch such as diluted hydrofluoric acid can be used to serve dual purposes: simultaneously removing $SiO_2$ and serving as pre-clean step before depositing conducting material on top of the S/D.

Figure 12:
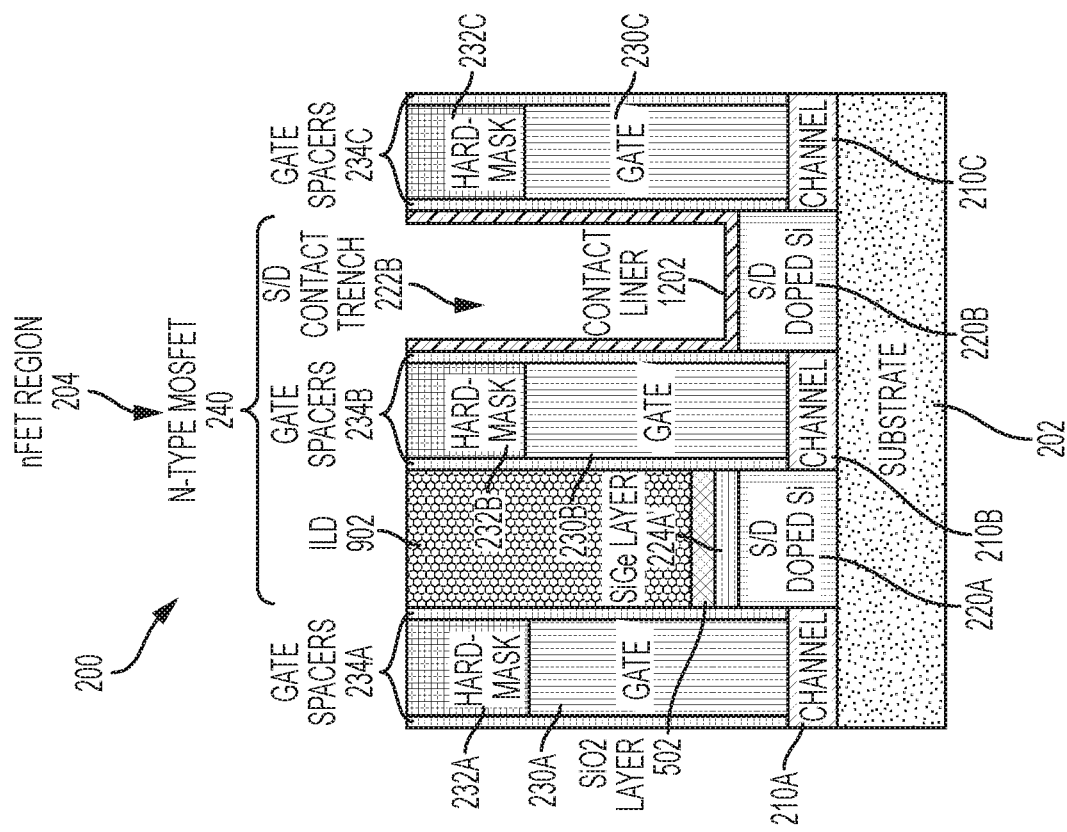

In FIG. 12, known semiconductor fabrication processes have been used to form the contact liner 1202, which is configured and arranged to minimize contact resistance. For an n-type S/D, the liner 1202 can be titanium (Ti). For an n-type S/D, the liner 1202 can also be nickel platinum (NiPt). The "bulk" contact (or fill material) 1302 can include conducting metal(s), which can be the same for both the n-type S/D and the p-type S/D. The metal contact fill 1302 can be tungsten (W), aluminum (Al), copper (Cu), or cobalt (Co), and can further include a barrier layer (not shown). The barrier layer can be titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In embodiments of the invention, the barrier layer can be conformally deposited in the trench(es) by ALD, CVD, MOCVD, PECVD, or combinations thereof. In embodiments of the invention, the metal fill 1302 can be formed by ALD, CVD, and/or PVD to form the electrical contacts.

Figure 13:
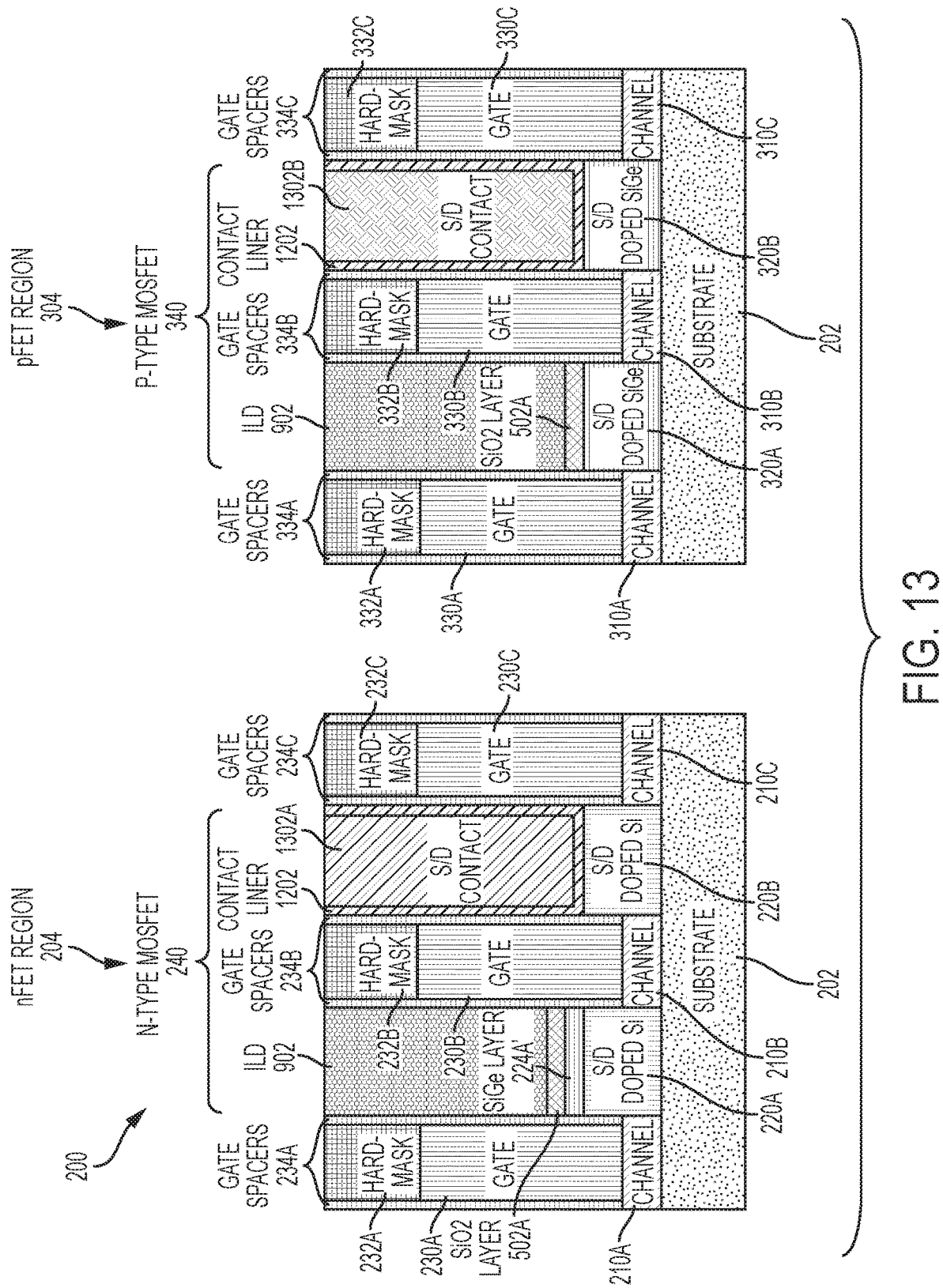

FIG. 13 depicts the semiconductor structure 200 showing the results of the above-described fabrication processes applied to both the nFET region 204 and the pFET region 304. Additionally, in FIG. 13, known semiconductor fabrication processes have been used to form the S/D contacts 1302A, 1302B. In embodiments of the invention, the S/D contact 1302A can be formed from any suitable conducting material. Examples of suitable materials for the S/D contact 1302A include titanium (Ti). In embodiments of the invention, the S/D contact 1302B can be formed from any suitable conducting material. Examples of suitable materials for the S/D contact 1302B include NiPt (nickel platinum). The S/D contacts 1302A, 1302B can further include dopants that are incorporated during or after deposition.

In embodiments of the invention, different conductive materials can be deposited on n-type S/D and p-type S/D to minimize the contact resistance of n-type and p-type S/D, respectively. Three approaches can be used to achieve this goal. First, the different conductive materials can be two different conductive liners (e.g., Ti for n-type S/D and NiPt for p-type S/D) with the remaining contact trenches filled with a common conductive material (e.g., tungsten or cobalt). Second, the entire n-type S/D contact trench can be filled with Ti, and the entire p-type S/D contact trench can be filled with NiPt. Third, the entire n-type S/D contact trench can be filled with Ti, and the entire p-type S/D contact trench can be filled with NiPt liner plus tungsten or cobalt filling the rest of the p-type contact trench.

In the embodiments of the invention, the gates 230A, 230B, 230C, 330A, 330B, 330C can be a dummy gate, and a replacement-metal-gate (RMG) fabrication process will be used to replace the dummy gates 230A, 230B, 230C, 330A, 330B, 330C with a metal gate structure. The dummy gates 230, 240 can be removed using a so-called poly open CMP (POC) process in which the dummy gates 230A, 230B, 230C, 330A, 330B, 330C can be removed by an etching process, e.g., RIE or chemical oxide removal (COR), to form trenches between the gate spacers 234A, 234B, 234C, 334A, 334B, 334C. The metal gate structure can include a metal liner, e.g., a work-function metal, and a gate metal deposited on a high-k dielectric material. In one or more embodiments, the metal liner can be, for example, TiN or TaN, and the gate metal can be aluminum or tungsten. Known process flows for the metal gate formation involves multiple annealing operations, including, for example, a high-k post-deposition anneal (PDA) and a high temperature anneal applied to the high-k dielectric to improve reliability.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

What is claimed is:

1. A set of semiconductor devices formed on a substrate, the devices comprising:
    an n-type region comprising:
        a first n-type shared source or a drain (S/D) region;
        a second n-type shared S/D region;
        a first layer of protective material over a top surface of the second n-type shared S/D region, wherein the first layer of protective material comprises a first type of material and a second type of material; and
        a first segment of a second layer of protective material over the first layer of protective material, wherein the first segment of the second layer of protective material comprises an oxide of a first instance of the second type of material;
        wherein the first type of material in the first layer of protective material comprises a diffused first type of material that has been diffused into the first layer of protective material from the first segment of the second layer of protective material; and
        wherein the oxide of the first instance of the second type of material comprises a result of a reaction between oxygen in the first segment of the second layer and a portion of the first instance of the second type of material that originated in the first layer of protective material; and
    a p-type region comprising:
        a first p-type shared S/D region;
        a second p-type shared S/D region; and
        a second segment of the second layer of protective material over a top surface of the second p-type shared S/D region, wherein the second segment of the second layer of protective material comprises the oxide of a second instance of the second type of material;
        wherein the oxide of the second instance of the second type of material comprises a result of a reaction between oxygen in the second segment of the second layer and a portion of the second instance of the second type of material that originated in a third protective layer adjacent the second segment of the second layer of protective material.

2. The devices of claim 1, wherein the third protective layer comprises an upper region of the second p-type shared S/D region.

3. The devices of claim 1, wherein the first n-type shared S/D region and the second n-type S/D region each comprises doped silicon.

4. The devices of claim 2, wherein:
    the first p-type shared S/D region and the second p-type shared S/D region each comprises doped silicon germanium;
    the first type of material comprises germanium; and
    the second type of material comprises silicon.

5. The devices of claim 1 further comprising:
    a first contact liner formed over the first n-type shared S/D region;
    a second contact liner formed over the first p-type shared S/D region;
    a first dummy contact formed over the first segment of the second layer of protective material in the n-type region;
    a second dummy contact formed over the second segment of the second layer of protective material in the p-type region;
    a first contact formed from a first type of conductive material over the first contact liner; and
    a second contact formed from a second type of conductive material over the second contact liner.

6. The devices of claim 5, wherein the first type of conductive contact material is selected based at least in part on the first type of conductive contact material's ability to reduce contact resistance in an n-type transistor environment.

7. The devices of claim 6, wherein the second type of conductive contact material is selected based at least in part on the second type of conductive contact material's ability to reduce contact resistance in a p-type transistor environment.

* * * * *